US009880892B2

(12) United States Patent
Bickford et al.

(10) Patent No.: US 9,880,892 B2
(45) Date of Patent: Jan. 30, 2018

(54) SYSTEM AND METHOD FOR MANAGING SEMICONDUCTOR MANUFACTURING DEFECTS

(71) Applicant: International Business Machines Corporation, Armonk, NY (US)

(72) Inventors: Jeanne P. S. Bickford, Essex Junction, VT (US); Nazmul Habib, Colchester, VT (US); Baozhen Li, South Burlington, VT (US); Pascal A. Nsame, Essex Town, VT (US)

(73) Assignee: International Business Machines Corporation, Armonk, NY (US)

( * ) Notice: Subject to any disclaimer, the term of this patent is extended or adjusted under 35 U.S.C. 154(b) by 734 days.

(21) Appl. No.: 14/187,783

(22) Filed: Feb. 24, 2014

(65) Prior Publication Data

US 2015/0241511 A1    Aug. 27, 2015

(51) Int. Cl.
   *G01R 31/26*   (2014.01)
   *G06F 11/00*   (2006.01)
   *H01L 21/66*   (2006.01)
   *G01R 31/28*   (2006.01)

(52) U.S. Cl.
   CPC ............ *G06F 11/008* (2013.01); *H01L 22/10* (2013.01); *H01L 22/20* (2013.01); *G01R 31/2849* (2013.01)

(58) Field of Classification Search
   CPC ... G01R 31/2849; G06F 11/008; H01L 22/10; H01L 22/20
   USPC ...................... 324/750.01–765.01
   See application file for complete search history.

(56) References Cited

U.S. PATENT DOCUMENTS

| 6,301,970 | B1 | 10/2001 | Biggs et al. |
| 6,684,349 | B2* | 1/2004 | Gullo .................... G06F 11/008 |
| | | | 701/32.1 |
| 6,977,517 | B2* | 12/2005 | Miao .................. G01R 31/2635 |
| | | | 324/750.05 |
| 7,107,491 | B2 | 9/2006 | Graichen et al. |
| 7,146,292 | B2 | 12/2006 | Rossi et al. |
| 7,184,932 | B1 | 2/2007 | Lopez et al. |

(Continued)

OTHER PUBLICATIONS

Le, Notice of Allowance and Fee(s) Due for U.S. Appl. No. 13/948,811 dated Mar. 19, 2015, 14 pages.

(Continued)

*Primary Examiner* — Melissa Koval
*Assistant Examiner* — Rahul Maini
(74) *Attorney, Agent, or Firm* — Steven Meyers; Hoffman Warnick LLC

(57) ABSTRACT

A method of managing semiconductor manufacturing defects, the method including: determining a cumulative aging parameter for each of a plurality of first IC products produced with a particular manufacturing line, the cumulative aging parameter being dependent on a product operating condition; calculating an observed defect rate for the plurality of first IC products based on a difference between a predicted value of a aging parameter and the cumulative aging parameter for each of the plurality of first IC products; and adjusting a manufacturing reliability model for the particular manufacturing line in response to the observed defect rate being different from an initial predicted defect rate for the plurality of first IC products wherein the manufacturing reliability model reestablishes the initial predicted defect rate.

17 Claims, 6 Drawing Sheets

(56) References Cited

U.S. PATENT DOCUMENTS

| | | |
|---|---|---|
| 7,567,891 B1 | 7/2009 | Liu et al. |
| 7,710,131 B1 | 5/2010 | Tiernan |
| 7,792,595 B1* | 9/2010 | Bomholt ............. G06F 17/5009 700/29 |
| 7,835,890 B2 | 11/2010 | Wu et al. |
| 8,103,463 B2 | 1/2012 | Kalgren et al. |
| 8,127,157 B2 | 2/2012 | Bilak |
| 8,201,038 B2 | 6/2012 | Graas et al. |
| 8,260,708 B2 | 9/2012 | Potkonjak |
| 8,819,603 B1* | 8/2014 | Clark .................. G06F 17/5068 716/136 |
| 2002/0019870 A1 | 2/2002 | Chirashnya |
| 2003/0057971 A1 | 3/2003 | Nishiyama et al. |
| 2004/0078634 A1 | 4/2004 | Gilstrap |
| 2004/0153679 A1 | 8/2004 | Fitton et al. |
| 2007/0088974 A1 | 4/2007 | Chandwani |
| 2008/0086708 A1 | 4/2008 | Rittman |
| 2008/0140362 A1 | 6/2008 | Gross |
| 2009/0076790 A1 | 3/2009 | Fein |
| 2011/0141912 A1* | 6/2011 | Soures ................ G06F 11/0733 370/242 |
| 2011/0231697 A1 | 9/2011 | Berke et al. |
| 2012/0123745 A1 | 5/2012 | Sheu et al. |
| 2013/0086395 A1* | 4/2013 | Liu ....................... G06F 9/5094 713/300 |
| 2013/0090900 A1 | 4/2013 | Gering |

OTHER PUBLICATIONS

Libby, "Effective HPC hardware management and Failure prediction strategy using IPMI", Proceedings of the Linux Symposium, 2003.
JEDEC Solid State Technology Association, "Failure Mechanism and Models for Semiconductor Devices", Oct. 2011.
Vigrass, "Calculation of Semiconductor Failure Rates".
Loughmiller, "Quality and Reliability of Semiconductor Devices", Micron Group, Inc.
Sony, "Semiconductor Device Reliability Verification", Semiconductor Quality and Reliability Handbook.
Lu et al., "Improved Thermal Management with Reliability Banking", IEEE Computer Society, 2005, pp. 40-49.
Lu et al., "Interconnect Lifetime Prediction for Reliability-Aware Systems", IEEE Transactions on Very Large Scale Integration (VLSI) Systems, vol. 15, No. 2, Feb. 2007, pp. 159-172.
Lu et al., "Interconnect Lifetime Prediction under Dynamic Stress for Reliability-Aware Design", IEEE, 2004, pp. 327-334.
Srinivasan et al., "The Case for Lifetime Reliability-Aware Microprocessors", Proceedings of the 31st Annual International Symposium on Computer Architecture (ISCA '04), 2004, 12 pages.

* cited by examiner

SYSTEM AND METHOD FOR MANAGING SEMICONDUCTOR MANUFACTURING DEFECTS

CROSS-REFERENCE TO RELATED APPLICATIONS

The current application is related to co-owned and co-pending U.S. patent application Ser. No. 13/948,811, filed on Jul. 23, 2013, and entitled "In-Situ Computing System Failure Avoidance."

BACKGROUND

The invention relates generally to the manufacture and performance of semiconductor devices, particularly to managing semiconductor manufacturing defects in a manufacturing line.

Computing systems and the integrated circuits (ICs) therein are typically designed for a specific total operating time or number of power on hours (POH) over their useful life, which can be referred to as the design life. This design life can estimate the lifespan or reliability of an IC, where the elapse of a particular number of POH can act as a flag for replacing the product. The aging of a manufactured component over time can be predicted mathematically in a "reliability model" of the manufacturing line which produced the component.

Current manufacturing reliability models use expected values of temperature and/or voltage, such as a specification, design, and/or or nominal operating temperature or voltage of a system, device, and/or IC chip, at the time of design to predict a total operating time of the system. However, actual operating conditions (e.g., temperatures and voltages) can vary significantly, altering the actual time remaining until failure of the system and/or the system's components. In addition, some products may use voltages that are different from their intended voltage during operation. IC products may have a true design life that differs significantly from what the reliability model of their manufacturing line predicts.

SUMMARY

A first aspect of the present disclosure provides a method of managing semiconductor manufacturing defects. The method can include: determining a cumulative aging parameter for each of a plurality of first IC products produced with a particular manufacturing line, the cumulative aging parameter being dependent on a product operating condition; calculating an observed defect rate for the plurality of first IC products based on a difference between a predicted value of the aging parameter and the cumulative aging parameter for each of the plurality of first IC products; and adjusting a manufacturing reliability model for the particular manufacturing line in response to the observed defect rate being different from a predicted defect rate for the plurality of first IC products.

A second aspect of the present disclosure provides a system for managing semiconductor manufacturing defects, the system comprising: a determining component which determines a cumulative aging parameter for each of a plurality of IC products produced with a particular manufacturing line, the cumulative aging parameter being dependent on a product operating condition; a calculating component which calculates an observed defect rate for the plurality of IC products based on a difference between a predicted value of the aging parameter and the cumulative aging parameter for each of the plurality of IC products; and a modeling component which adjusts a manufacturing reliability model for the particular manufacturing line in response to the observed defect rate being different from a predicted defect rate for the plurality of IC products.

A third aspect of the present disclosure provides a program product stored on a computer readable storage medium. The program product can be operative to manage semiconductor manufacturing defects when executed, and the computer readable storage medium can include program code for: determining a cumulative aging parameter for each of a plurality of IC products produced with a particular manufacturing line, the cumulative aging parameter being dependent on a product operating condition; calculating an observed defect rate for the plurality of IC products based on a difference between a predicted value of the aging parameter and the cumulative aging parameter for each of the plurality of IC products; and adjusting a manufacturing reliability model for the particular manufacturing line in response to the observed defect rate being different from a predicted defect rate for the plurality of IC products.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
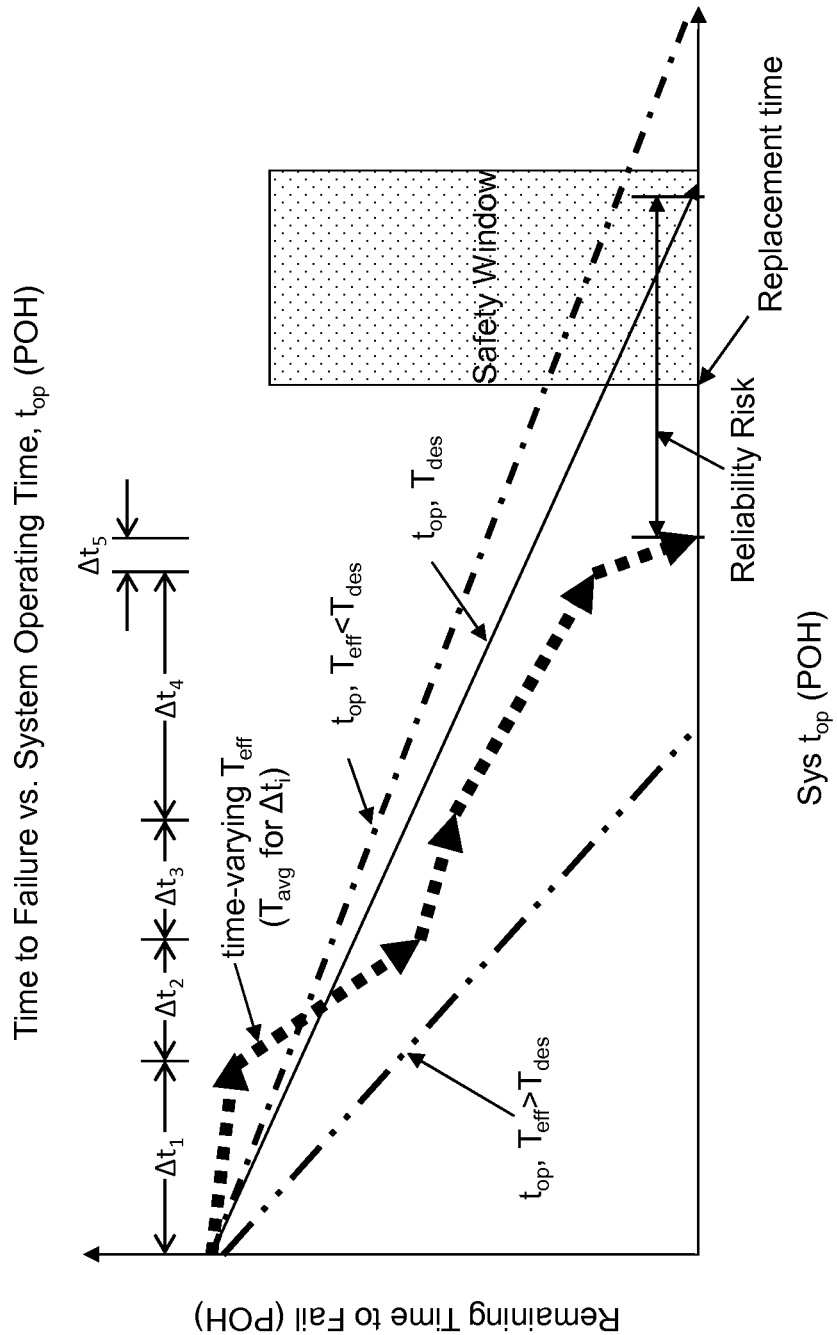
FIG. 1 is an illustrative plot of an example cumulative aging parameter versus system operating time for an IC product according to an embodiment of the present disclosure.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Because of variations in temperature, voltage, and other operating conditions, the aging of an IC product in a particular environment (e.g., a computing system) can increase or decrease, causing the IC product to fail before the predicted time for failure or replacement predicted with conventional methods. This situation is illustrated, for example, in FIG. 1, which shows a plot of remaining time to fail vs. system operating time at various operating conditions. The remaining time to fail is a type of "cumulative aging parameter." Generally, a "cumulative aging parameter" can include any physical property which represents an aspect of an IC product's lifespan, and may include a total operating time, effective operating time, etc. Operating an IC product at a higher-than-intended temperature, for example, can cause some of the circuitry, components, etc., within the IC product's architecture to wear out more quickly and decrease an IC product's useful lifespan. The cumulative aging parameters may depend on particular operating conditions of the IC product, such as temperature, voltage, stress, strain, etc. The solid line represents a typical curve obtained using a design or nominal operating temperature of an IC product.

A failsafe or "safety window" can account for some variation in operating conditions; at a threshold value of operating time before an estimated time until failure, a particular IC product can be repaired or replaced. However, if the actual effective operating temperature is lower than design or nominal ($T_{eff} < T_{des}$), failure can occur later, as illustrated by the upper dashed line in FIG. 1, and can fall significantly beyond the failsafe window. This can result in premature replacement of the IC product. Should the operating temperature be higher than design temperature ($T_{eff} > T_{des}$), as illustrated by the lower dashed line, failure can occur sooner, in some cases far sooner, than predicted. This form of accelerated aging can cause the IC product to fail, reducing the total capacity of any systems or products in which the IC product is used. It should be noted that "time of operation," "operation time," and "operating time" may be used interchangeably herein, and that this quantity is but one type of "cumulative aging parameter" which can be measured and used in embodiments of the present disclosure.

Embodiments of the present disclosure can use operating parameters from deployed products to manage a manufacturing line for producing IC products. Starting with a cumulative aging parameter set to a nominal or predicted value for each IC product, observed cumulative aging parameters can be communicated to a particular manufacturing line to update the predictive values stored in a manufacturing computer system. Predictive values and models can be stored within a "reliability model" of a manufacturing line, which can quantify the type and probability of defects in the manufactured IC products. An in-situ failure avoidance method and/or system can monitor one or more product operating conditions to compute cumulative aging parameters, such as effective operating time and/or exposure of each IC product based on the one or more product operating conditions. These values can then be used to determine, estimate, and/or derive predictive models for estimating the remaining lifespan of each IC product.

In the event that one or more IC products in a particular system fail, a failure recovery process or action can be performed, such as retrying an instruction, repairing a bitcell and/or bitline, reconfiguring a computing system to shift load away from the affected IC product(s), and/or adjusting controllable product operating conditions (e.g., voltage), among other things. In the event that the failure is not recoverable, a failure recovery is not successful, and/or no failure has occurred but a total or effective operating time has passed a threshold value, then the IC product can be replaced and/or repaired. In addition, workload of the system using the relevant IC product(s) can be adjusted to balance several IC products within one system, to age one or more IC products faster or slower than others, and/or to achieve other goals as may be desired and/or suitable. For example, if two IC products each include cores of a multi-core processing chip, and one core has degraded or otherwise aged more quickly than another core, workload can be shifted to the core with higher remaining time to replace so that the two cores can have more synchronized aging. This can delay or prevent replacing a chip with a core that has significant life left and/or can extend the effective life of the chip.

The above general description of embodiments is illustrated in FIG. 1 by the line composed of a series of arrows. Each arrow can represent an interval $\Delta t_i$ during and/or after which the cumulative aging parameter(s) can be measured. For example, an effective operating time for each IC product during each interval $\Delta t_i$ can be determined, and a predicted remaining operating time to replace can be updated by subtracting the effective operating time at each interval. By tracking the cumulative aging parameters, and adjusting the predictions of these values in a reliability model of a particular manufacturing line, the system-level manufacturing data can continuously and accurately estimate the characteristics of a group of IC products. In the first interval $\Delta t_1$ illustrated, the IC product aged more slowly than originally estimated using typical techniques as a result of operating at a lower temperature than design ($T_{avg} < T_{des}$), but in the next interval $\Delta t_2$, aging accelerated due to operating at a higher temperature than design ($T_{avg} > T_{des}$), and so forth. The "reliability model" of the semiconductor manufacturing line can be adjusted by collecting data from multiple IC products or groups of IC products (e.g., performance and failure data) and using this information to update the reliability model's predictions. Thus, manufacturers and customers can accurately estimate a product's true total operating time.

Figure 2:
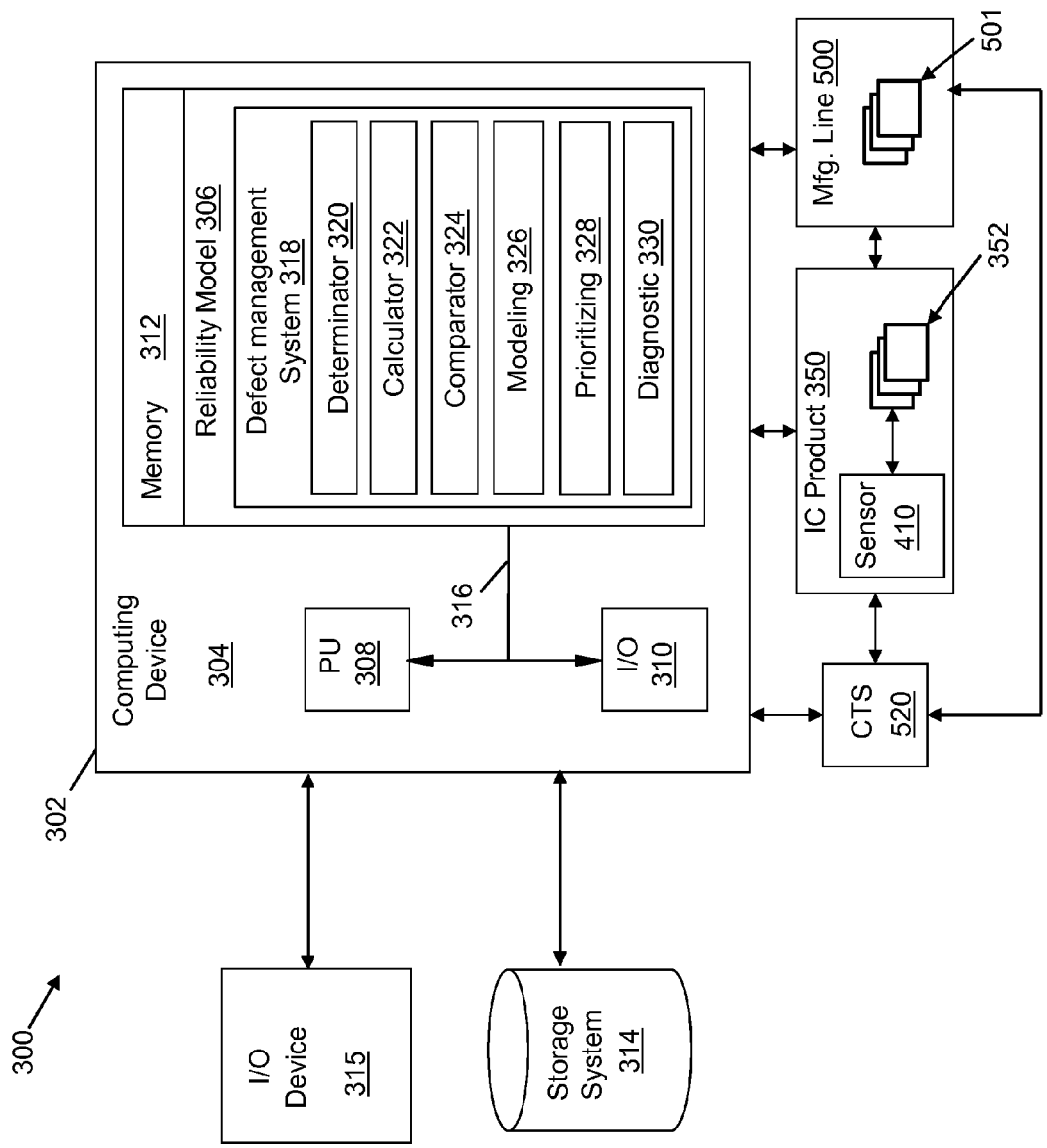
FIG. 2 is an illustrative environment which includes a computer system interacting with IC products according to an embodiment of the present disclosure.

Turning now to FIG. 2 an illustrative environment 300 for implementing the method and/or system described herein is shown. The method and/or system may be coded as a set of instructions on removable or hard media for use by a general-purpose computer, and thus may, in embodiments, include a computer program product. FIG. 2 is also a schematic block diagram of a general-purpose computer for practicing the present invention. In particular, a computer system 302 is shown as including a computing device 304. Computing device 304 can include a reliability model 306 (which may also be referred to as a "manufacturing reliability model"), which can manage semiconductor manufacturing defects by performing any/all of the processes described herein and implementing any/all of the embodiments described herein.

Computer system 302 is shown including a processing unit 308 (e.g., one or more processors), an I/O component 310, a memory 312 (e.g., a storage hierarchy), an external storage system 314, an input/output (I/O) device 315 (e.g., one or more I/O interfaces and/or devices), and a communications pathway 316. In general, processing unit 308 can execute program code, such as reliability model 306, which is at least partially fixed in memory 312. While executing program code, processing unit 308 can process data, which can result in reading and/or writing transformed data from/to memory 312 and/or I/O device 315 for further processing. Pathway 316 provides a communications link between each of the components in environment 300. I/O component 310 can comprise one or more human I/O devices, which enable a human user to interact with computer system 302 and/or one or more communications devices to enable a system user to communicate with the computer system 302 using any type of communications link. To this extent, reliability model 306 can manage a set of interfaces (e.g., graphical user interface(s), application program interface(s), etc.) that enable human and/or system users to interact with reliability model 306. Further, reliability model 306 can manage (e.g., store, retrieve, create, manipulate, organize, present, etc.) data, through several modules contained within a defect management system 318.

In any event, computer system 302 can comprise one or more general purpose computing articles of manufacture (e.g., computing devices 304) capable of executing program code, such as reliability model 306, installed thereon. As used herein, it is understood that "program code" means any collection of instructions, in any language, code, or notation, that cause a computing device having an information processing capability to perform a particular function either directly or after any combination of the following: (a) conversion to another language, code or notation; (b) reproduction in a different material form; and/or (c) decompression. To this extent, reliability model 306 can be embodied as any combination of system software and/or application software.

Further, reliability model 306 can include a defect management system 318. In this case, various modules of defect management system 318 can enable computer system 302 to perform a set of tasks used by reliability model 306, and can be separately developed and/or implemented apart from other portions of reliability model 306. As used herein, the term "component" means any configuration of hardware, with or without software, which implements the functionality described in conjunction therewith using any solution, while the term "module" means program code that enables computer system 302 to implement the functionality described in conjunction therewith using any solution. When fixed in memory 312 of computing device 304 which includes processing unit 308, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of computing device 304.

Several modules of defect management system 318 are shown in FIG. 2 by way of example. A determinator module 320 can issue instructions, commands, etc. based on data stored within memory 312 of computing device 304, or other pieces of information provided thereto. A calculator module 322 can perform mathematical computations, a comparator module 324 can compare two or more data quantities, a modeling module 326 can or subtract variables to/from or otherwise adjust mathematical models, a prioritizing module 328 can arrange and/or rearrange lists of data or other quantities based on various regimes for ranking information, and a diagnostic module 330 can derive related physical conditions, quantities, etc. of an item from particular data inputs via algorithms, look-up tables, etc. Each module discussed herein can obtain and/or operate on data from exterior components, units, systems, etc. or from memory 312 of computing device 304. In a particular example, the data provided to defect management system 318 of reliability model 306 can be obtained from, e.g., one or more IC products 350. Each IC product 350 can include a respective product design, and in some embodiments reliability model 306 can model numerous distinct product designs for IC products 350 produced with the same manufacturing line.

In some cases, each IC product 350 can include sensors 410 (e.g., temperature or voltage sensors) and subcomponents 352 thereon. Embodiments of the present disclosure can include additional hardware, software, etc. on an IC product 350 to measure, record, and/or analyze pertinent types of data as discussed elsewhere herein with respect to FIG. 4. Each IC product 350 can be produced with a manufacturing line 500 which can also include manufacturing subcomponents 501 stored thereon. Manufacturing line 500, in addition to producing one or more IC products 350, can maintain a data communication with IC products 350 and/or computer system 302. In addition, a central tracking system (CTS) 520 can exchange data and/or communicate with computer system 302, IC product 350, and/or manufacturing line 500. CTS 520 is an optional data tracking component which can maintain data in a location separate and remote from each IC product 350 and manufacturing line 500, if desired.

Where computer system 302 comprises multiple computing devices, each computing device may have only a portion of reliability model 306 and/or defect management system 318 fixed thereon (e.g., one or more modules). However, it is understood that computer system 302 and reliability model 306 are only representative of various possible equivalent computer systems that may perform a process described herein. To this extent, in other embodiments, the functionality provided by computer system 302 and reliability model 306 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 302 includes multiple computing devices, the computing devices can communicate over any type of communications link. Further, while performing a process described herein, computer system 302 can communicate with one or more other computer systems using any type of communications link. In either case, the communications link can comprise any combination of various types of wired and/or wireless links; comprise any combination of one or more types of networks; and/or use any combination of various types of transmission techniques and protocols. Computer system 302 can obtain or provide data, such as data stored in storage system 312, using any solution. For example, computer system 302 can generate and/or be used to generate data from one or more data stores, receive data from another system, send data to another system, etc.

While shown and described herein as a method and system for managing semiconductor manufacturing defects, it is understood that aspects of the invention further provide various alternative embodiments. For example, in one embodiment, the invention provides a computer program fixed in at least one computer-readable medium, which when executed, enables the management of semiconductor manufacturing defects. To this extent, the computer-readable medium includes program code, such as reliability model 306, which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as reliability model 306, which implements some or all of the processes described herein. In this case, a computer system can process a copy of program code that implements some or all of the processes described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for managing semiconductor manufacturing defects. In this case, a computer system, such as computer system 302, can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 3:
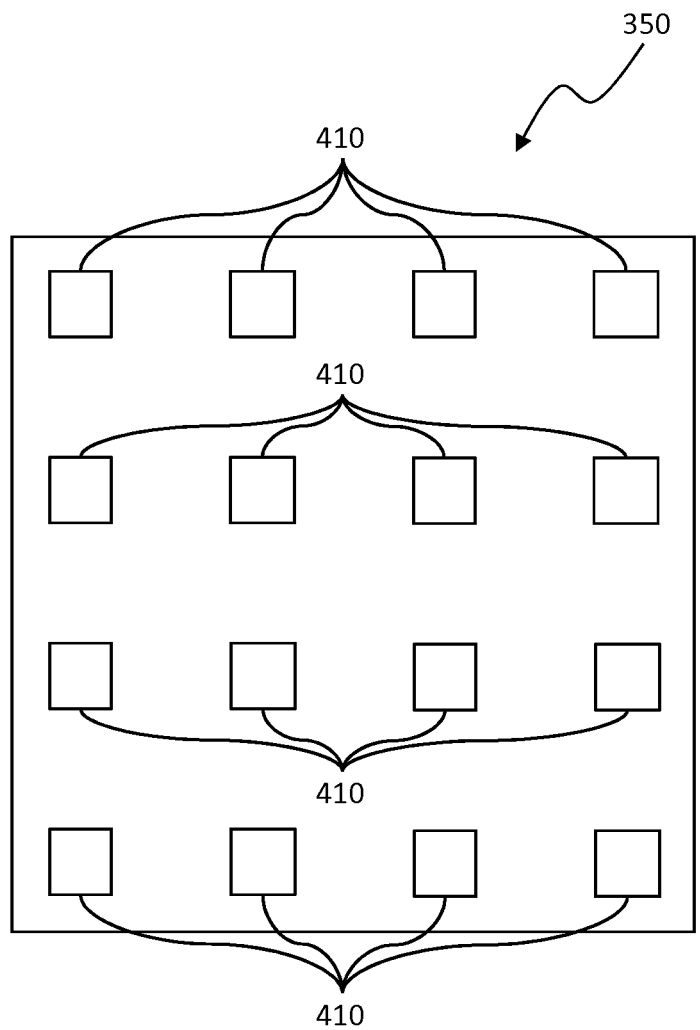
FIG. 3 is a schematic illustration of an IC product with a system for monitoring IC product operating conditions according to an embodiment of the present disclosure.

FIG. 3 shows a schematic representation of an IC product 350 with which embodiments of the present disclosure may be employed. As shown, IC product 350 can include at least one sensor 410, such as a temperature sensor, a voltage sensor, an accelerometer, and/or any other suitable sensor and/or sensing device as may be desired, appropriate, and/or available now and/or in the future. For example, many semiconductor devices currently constructed include temperature sensors to monitor particular components and/or other devices that are part of the unit. In addition, as shown, an IC product 350 can include a plurality of sensors 410 distributed substantially uniformly across IC product 350 to enable a spatial profile of a sensed operating condition of IC product 350 to be more easily determined. Examples of parameters, such as operating parameters and/or electrical parameters, that may be sensed and/or tracked and/or monitored include, but are not limited to, temperature, voltage, power, stress, strain, speed, acceleration, and/or vibration. Each sensor 410 can be connected to a computer system, such as computer system 302 of FIG. 2, such that computer system 302 and/or any program running thereon and/or any component and/or device therein can access information provided by any sensor 410. For example, a computer program product in particular embodiments can access information provided by sensors 410, information gleaned therefrom being usable in operation of the computer program product.

Figure 4:
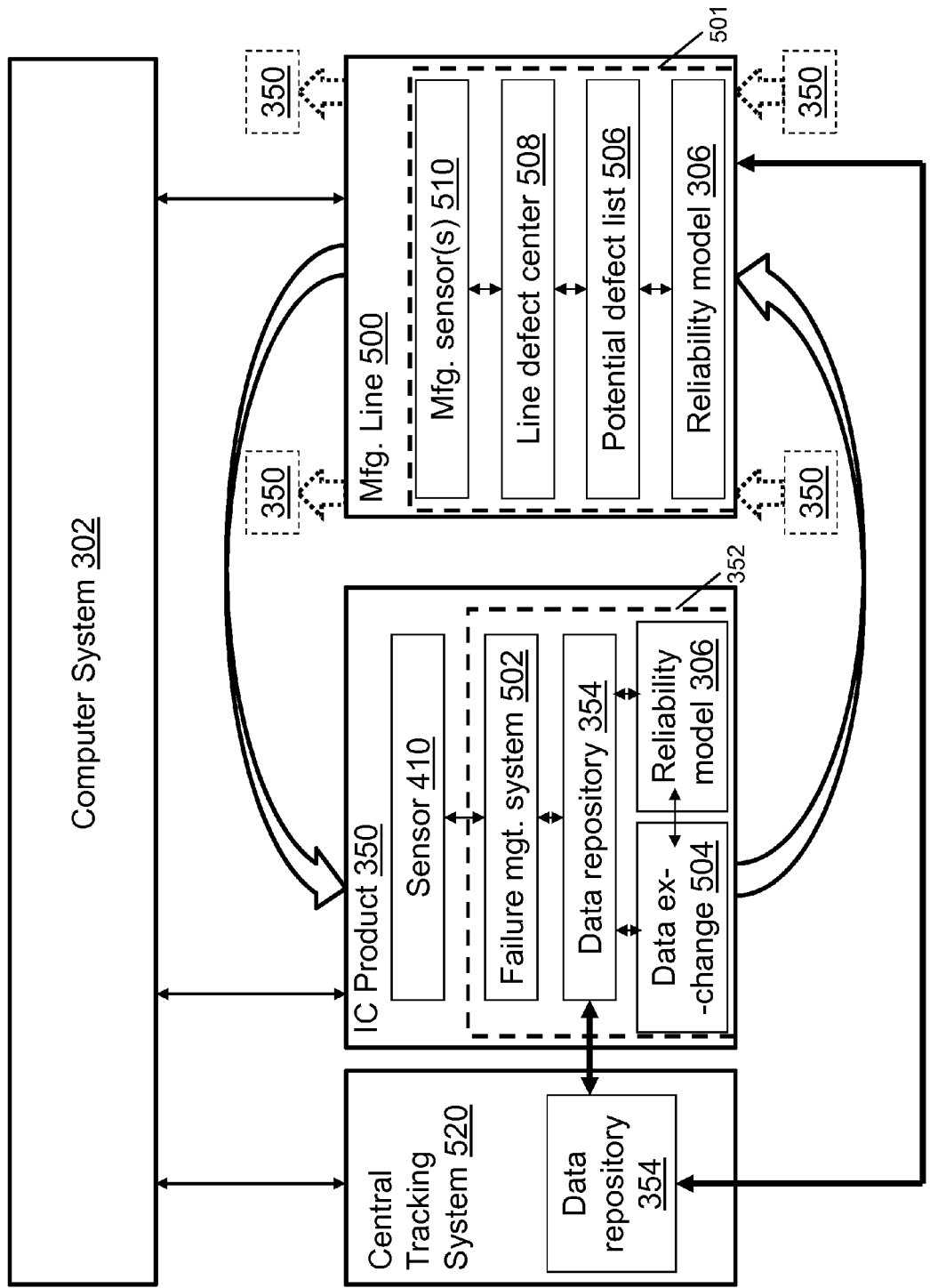
FIG. 4 is a schematic illustration of a manufacturing line and IC products according to an embodiment of the present disclosure.

Turning to FIG. 4, a schematic block diagram for illustrating subcomponents 352 and manufacturing subcomponents 501 in more detail is shown. Embodiments of the present disclosure can use data from each IC product 350 manufactured with a particular manufacturing line 500 to update reliability model 306 of manufacturing line 500. Reliability model 306 is shown in FIG. 4 as being part of manufacturing line 500 and/or IC product 350. Reliability model 306 is also shown in FIG. 2 as part of computer system 302 as an additional or alternative embodiment of the disclosure. Reliability model 306 can be stored on computer system 302, IC product 350, and/or manufacturing line 500 because reliability model 306 can apply to all circuits in a particular product or a subset thereof, depending on circumstances. It is understood that data couplings between computer system 302, IC product 350, and manufacturing line 500 can allow reliability model 306 to be updated in response to conditions described herein regardless of which component(s) where reliability model 306 is found. In yet another alternative embodiment, computer system 302 may be contained within manufacturing line 500 instead of being an independent system. As shown in FIG. 4, manufacturing line 500 can produce at least one IC product 350. One IC product 350 is shown in detail and other IC products 350 are shown in phantom for the purposes of illustration. IC product 350 can include one or more sensors 410 for measuring a product operating condition, e.g., temperature, voltage, power, stress, strain, speed, acceleration, and/or vibration, as discussed elsewhere herein.

Data repository 354 can record product operating conditions (e.g., temperatures and/or voltages) of IC product 350 over time and during operation. In addition or alternatively, data repository 354 can be in communication with memory 312 (FIG. 2) and/or storage system 314 (FIG. 2) of computer system 302, and for example may be a remote storage center or storage system distinct from computer system 302 and its corresponding components. Specifically, data repository 354 can be a "central data repository" (e.g., located within central tracking system 520) which may obtain data from several IC products 350 by any currently known or later developed systems and methods for data collection. In an embodiment, data repository 354 can be a central data repository which wirelessly obtains data from IC products 350 by a wireless communications protocol, e.g., Wi-Fi™, Ultra-Wide Band (UWB) radio, Bluetooth™, etc.

Each sensor 410 can be in communication with a failure management system 502 on IC product 350, which may be an in-situ system composed of a particular circuit, group of circuits, wiring design(s), etc. Failure management system 502 can estimate and/or monitor a cumulative aging parameter, such as the total operating time of IC product 350, by actions including, e.g., determining a total operating time or number of power on hours (POH) based on one or more product operating conditions (temperature, voltage, etc.), a failsafe or safety window, average or "effective" operating temperatures over particular tracking intervals, comparisons between an observed and predicted time to replace, etc. In addition, failure management system 502 can affect the operation of IC product 350 by redistributing loads based on the collected and analyzed information.

The information obtained with sensors 410 and processed in failure management system 502 can be stored in a data repository 354. Data repository 354 of IC product 350 may remain intact even where IC product 350 fails, e.g., by being isolated from parts of IC product 350 that are susceptible to damage. Some or all of the IC products 350 can include reliability model 306 or a portion thereof, which can interact with other subcomponents 352 of IC product 350. IC product 350 can also include a data exchange device 504 (e.g., a port, bus, wireless communication protocol device, etc.) for delivering data from an operational or failed IC product 350 to another system or device, such as manufacturing line 500.

After IC product 350 is deployed and/or some IC products 350 have failed, manufacturing line 500 can receive data from data repository 354 of IC product 350 by reading and/or obtaining data from IC product 350. Manufacturing line 500 can obtain data using any currently known or later developed data exchange method, e.g., through data exchange device 504. Thus, several IC products 350 (shown in phantom) are shown as providing data to reliability model 306 of manufacturing line 500. Reliability model 306, upon obtaining data from IC products 350, can analyze and adjust the predicted operating conditions, properties, etc., for IC products 350 produced with manufacturing line 500. Example methods for analyzing information from IC products 350 to update reliability model 306 are described in detail elsewhere herein. Reliability model 306 can also be in communication with a potential defect list 506 which stores a library of potential defects for each IC product 350. Potential defect list 506 can be arranged according to the relative probability of each defect. A user or system of manufacturing line 500 may adjust the timing and characteristics of particular manufacturing steps to accommodate the changing likelihood of defects found in potential defect list 506. In the event that updating reliability model 306 changes the relative probability of a defect on potential defect list 506, methods of the present disclosure can include changing the order of potential defect list 506. In turn, a user or system of manufacturing line 500 can change some manufacturing steps to account for the increased or decreased priority of a particular defect indicated with potential defect list 506.

To monitor product quality, reliability model 306 and/or potential defect list 506 can communicate with a line defect center 508 for storing performance values, e.g., "defect density" and/or "defect rate" of manufacturing line 500. The term "defect density," as used herein, can refer to the occurrence or likelihood of defects on a particular type of IC product 350, or within a particular area or sub-system of IC product 350. Line defect center 508 can allow users of manufacturing line 500 to adjust the characteristics of a particular manufacturing step to account for the true frequency of particular product defects. Manufacturing line 500 can also include one or more manufacturing sensors 510 in communication with reliability model 306, potential defect list 506, and/or line defect sensor 508. Manufacturing sensor 510 can analyze the material properties of IC products 350 produced with manufacturing line 500 to determine whether aging or failure data from each IC product 350 is based on unexpected product operating conditions of each IC product 350 or errors within manufacturing line 500.

A central tracking system 520 may be in communication with one or more IC products 350. Central tracking system 520 may be part of the same system, product, etc. in which IC product 350 is used, or may be a completely different system located at a remote site. Central tracking system 520 can include data repository 354 for storing data of product operating conditions for several IC products 350. Reliability model 306 of manufacturing line 500 can be in communication with central tracking system 520 through any currently known or later developed data coupling (whether wired or wireless) to obtain data for updating reliability model 306. By including central tracking system 520 with data repository 354 as a hub for several IC products 350 and manufacturing line 500, some data can be stored and retrieved despite failures which may damage or destroy information stored on IC product 350 itself.

Figure 5:
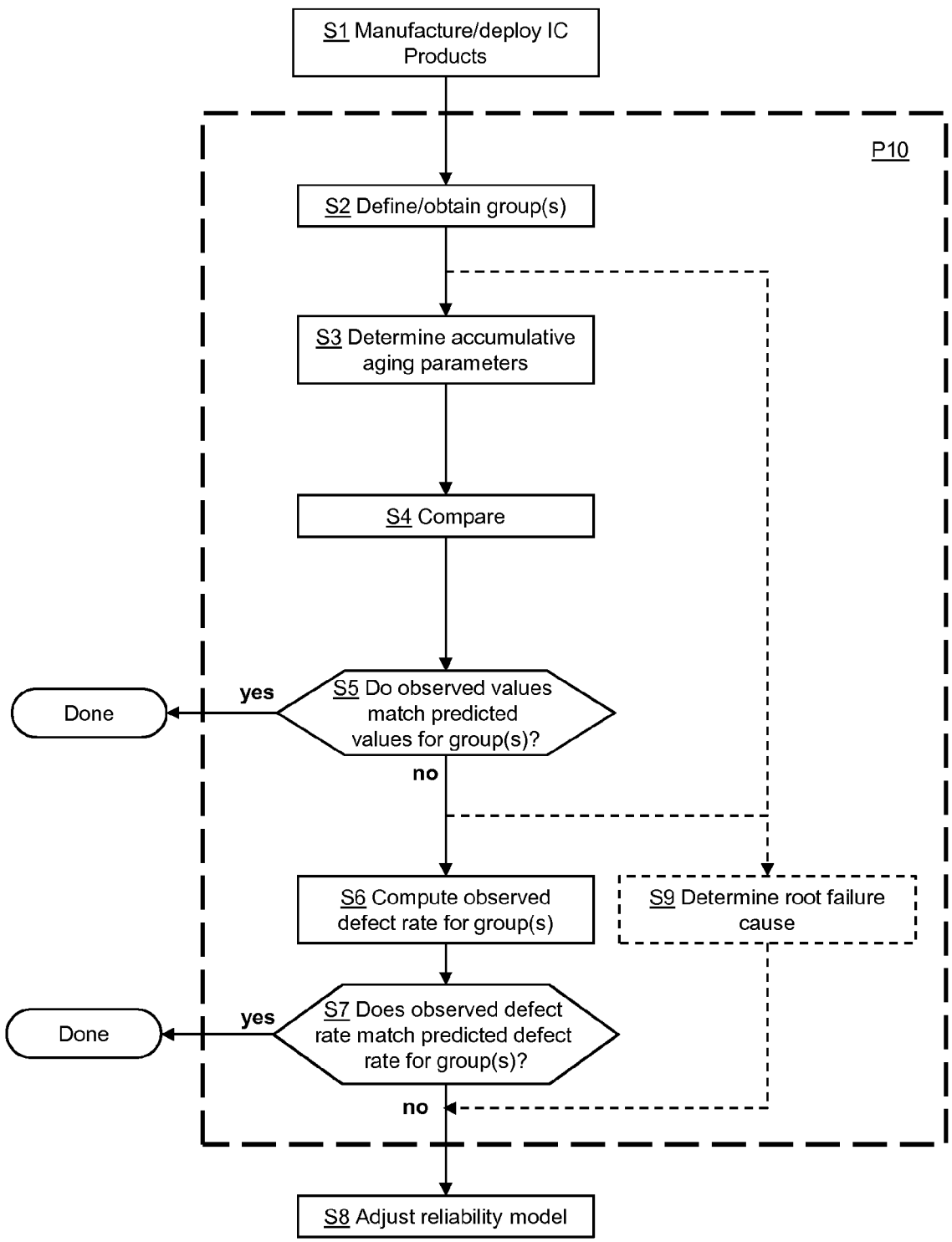
FIGS. 5-6 are example flow diagrams of methods for managing manufacturing defects according to embodiments of the present disclosure.

Referring to both FIG. 2 and FIG. 5, a method for managing manufacturing defects according to an embodiment of the present disclosure is shown. Methods of the present disclosure can include manufacturing several IC products 350 with a particular manufacturing line 500 (FIG. 4) in step S1. Methods according to the present disclosure can include dividing the deployed IC products 350 into groups to be examined in step S2. IC products 350 can be grouped according to any desired metric, including types of IC products 350 produced with manufacturing line 500 (FIG. 4). For example, three IC products with different designs but manufactured by the same manufacturing line can be assigned to three corresponding groups in step S2.

In step S3, determinator 320 of computer system 302 can determine a cumulative aging parameter for each IC product 350 in the group. To compute a cumulative aging parameter, embodiments of the method disclosed herein can use on-product and/or manufacturing sensors (e.g., sensors 410 (FIG. 3) and/or manufacturing sensors 510 (FIG. 4)) such as temperature sensors, voltage sensors, current sensors, timers and/or any other such sensors as may be deployed and/or included in any device of the computing system that embodiments can access and/or use and/or from which computer system 302 can otherwise receive a value related to a particular parameter for which the sensor is deployed. The measured operating condition values can be used to determine, e.g., a total operating time or effective operating time for each IC product 350, which can be subtracted in reliability model 306 from a predicted remaining time to replace the IC product. Some mathematical relationships for determining total and/or effective operating time of each IC product 350 are discussed herein. The effective operating time can be more or less time than has actually elapsed, depending on the particular operating conditions and/or circumstances. As discussed elsewhere herein, computer system 302 can determine whether to update reliability model 306 to accurately reflect the conditions under which IC products 350 operate.

Sources of aging in an IC product can include the degradation of circuitry from electromigration. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size in electronics such as integrated circuits (ICs) decreases, the practical significance of this effect increases. In situations where temperature and voltage-dependent phenomena such as electromigration affect a product, the tracked operating condition can include temperature $T_i$ and an effective operating temperature for a given interval $\Delta t$ can be determined using a relationship including:

$$T_{teff} = \left\{ \frac{1}{T_{des}} - \frac{\ln\left[\sum\left(\frac{\Delta t_i}{t_{op}}\right)e^{\left[\frac{\Delta H}{k}\left(\frac{1}{T_{des}} - \frac{1}{T_i}\right)\right]}\right]}{\left(\frac{\Delta H}{k}\right)} \right\}^{-1}, \quad t_{op} = \sum_{i=1}^{\infty} \Delta t_i$$

where $T_{teff}$ is effective temperature in the time domain, $t_{op}$ is operation time of the device, $T_{des}$, is a design operating temperature, $T_i$ is a measured temperature at a respective tracking interval, $\Delta t_i$ is the respective tracking interval, $\Delta H$ is electromigration activation energy, and k is Boltzmann's constant. Thermal acceleration can vary as between different sources of aging, and the relationship above can be modified accordingly to accommodate different causes of aging and/or failure. Thus, while the description includes details about electromigration as a source of aging, it should be understood that embodiments of the invention disclosed herein can be applied to other sources of aging and/or failure.

In addition or alternatively, certain cumulative aging parameters can be related to other product operating conditions, such as a space domain effective temperature for each device. For example, an IC product 350 can include multiple sensors 410, each of which can monitor one or more elements (e.g., sub-systems, regions, circuits, components, etc.) of IC product 350. Since temperature may not be uniform across IC product 350, an effective temperature for the entire IC can be determined using the values provided by sensors 410, such as by using the relationship:

$$f(T_{seff}) = \sum_{i=1}^{M} \frac{n_i}{N} f(T_i),$$

where $f(T_i)$ is the failure probability per element at measured $T_i$, $T_{seff}$ is effective temperature in the space domain, N is a total number of elements contributing to the corresponding source of aging (in this example, electromigration), M is the total number of temperature sensors used, $T_i$ is a temperature of a respective sensor, and $n_i$ is a number of elements tracked by a respective sensor.

Using one or both effective temperatures, a cumulative aging parameter in the form of effective operating time can be determined, such as by using the relationship:

$$t_{op_{eff}} = \Delta t \cdot e^{\frac{\Delta H}{k} \left( \frac{1}{T_{des}} - \frac{1}{T_{seff}} \right)}$$

where $t_{op\ eff}$ is effective operating time or time of operation, $T_{seff}$ is effective temperature in the space domain, M is the total number of temperature sensors used, $T_{des}$ is a design or nominal operating temperature of the device, k is Boltzmann's constant, and $\Delta t_i$ is the actual elapsed time of operation. While particular examples of relationships that can be employed to determine effective temperature, total operating time, and other factors are discussed, it should be apparent that any suitable relationship can be employed within the scope of the present disclosure.

In step S4, comparator 322 of computer system 302 can compare the cumulative aging parameter for each IC product 350 in the group with predicted values yielded from reliability model 306 for the cumulative aging parameter. In step S5, determinator 320 can determine whether the observed values for the cumulative aging parameter match or fall within a tolerance window for the predicted value(s) for the group in step S5. From this comparison, computer system 302 can end the method in the event that each observed value matches or falls within a tolerance window for the values predicted with reliability model 306. In other words, reliability model 306 need not be updated in the event that its predictions for each IC product 350 in the group are accurate. However, where determinator 320 determines that the observed values of the cumulative aging parameter are different from the values predicted with reliability model 306, the method can continue to further steps.

Embodiments of the present disclosure can compare the number of defects relative to total number of units ("defect rate") against a predicted defect rate yielded from reliability model 306. In step S6, calculator 324 can compute a defect rate for the group of IC products 350. Specifically, a "defect" as used herein may refer to situations where manufacturing errors, design problems, etc., cause an IC product 350 to degrade or fail more quickly than reliability model 306 predicts. Reliability model 306 may anticipate a particular defect rate of defective IC products 350 based on predictive data and/or previously manufactured groups of products. In step S7, determinator 320 can determine whether the observed defect rate of the group of IC products 350 matches or is substantially equal to the predicted defect rate from reliability model 306. Where the defect rate is at least substantially equal to the rate predicted with reliability model 306 (i.e., equal to, within a tolerance window or specified range for the predicted rate), computer system 302 may take no further action because reliability model 306 accurately predicted the defect rate for this group. Where the computed defect rate is not substantially equal to what reliability model 306 predicts, however, computer system 302 can adjust reliability model 306 in step S8.

In step S8, modeling module 326 can adjust reliability model 306 based on the predicted defect rate for the group of semiconductor devices 350 being different from the observed defect rate. In some situations, adjusting reliability model 308 in step S8 can include adjusting the relationship between one or more product operating conditions and any corresponding cumulative aging parameters (e.g., by increasing or decreasing the value of particular coefficients). In other cases, adjusting reliability model 306 can include changing the predicted values of certain operating conditions (e.g., temperature and/or voltage) based on the effective values for operating conditions being substantially different from their predicted values during operation. In still other cases, step S8 can include generating a new reliability model 306 in response to the observed data and/or input from a user or components of another system.

Methods according to the present disclosure can optionally include further analysis and data collection steps for each IC product 350. As shown in FIG. 5, methods of the present disclosure can include determining a root failure cause in step S9 (shown in phantom) for failed IC products 350, if any. Diagnostic module 330 of computer system 302 can determine a root failure cause for any failed IC products 350 before, after, or simultaneously with determining and analyzing the cumulative aging parameters and defect rate for the group. Diagnostic module 330 can include circuitry, programs, etc., for deriving a root failure cause from data obtained from a particular IC product 350. For example, where failed IC products 350 have failed, diagnostic module 330 can identify whether a particular source of aging (e.g., electromigration) caused the unit to fail by examining the corresponding history of product operating conditions (temperatures, voltages, etc.) and by mathematically determining (e.g., by formula, look-up table, etc.) whether the particular source of aging caused IC product 350 to fail. The root failure cause can be communicated to modeling module 326 for adjusting reliability model 306.

Steps S2-S7 and S9 are grouped together in FIG. 5 and designated as P10 (shown in phantom) for the sake of illustration and convenience. Further discussion herein includes other steps which may occur before and after the data collection and comparison steps shown in FIG. 5.

Figure 6:
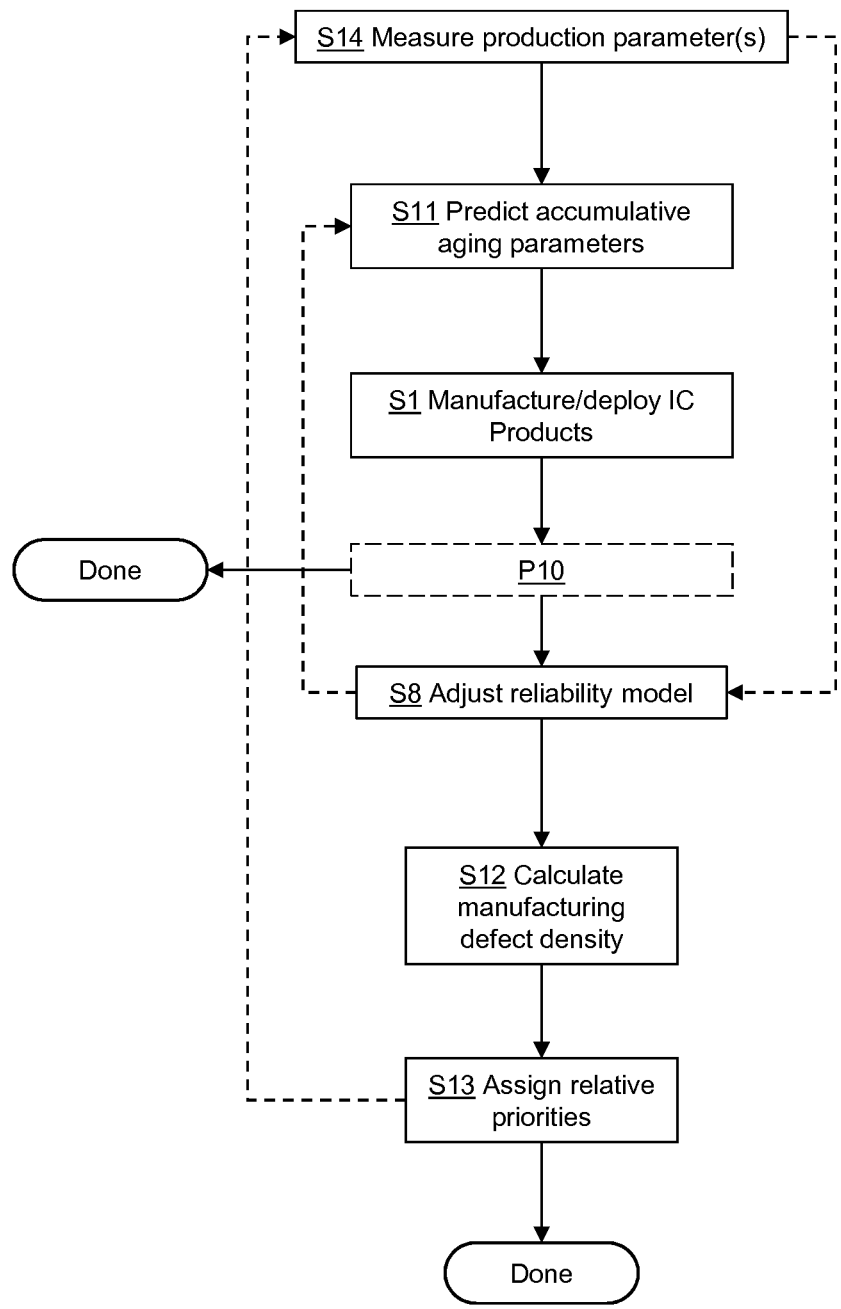

Turning to FIGS. 2 and 6, another example method for managing semiconductor manufacturing defects according to an embodiment of the present disclosure is shown. Before manufacturing IC products 350 in step S1 and/or after adjusting reliability model 306 in step S8, methods according to the present disclosure can optionally include a step S11 for using reliability model 306 to predict new cumulative aging parameters for other IC products 350. Specifically, in step S11, calculator 322 can use reliability model 306, in addition to a predicted set of operating conditions, the defect rate computed in step S6, and/or any root failure causes determined in step S11, to predict the aging of other IC products 350. In an example embodiment, calculator 322 can input data into reliability model 306 to predict a total operating time of other IC products 350 produced with manufacturing line 500 (FIG. 4). In addition, systems and/or users of manufacturing line 500 (FIG. 4), can adjust particular manufacturing steps based on the predicted cumulative aging parameters yielded in step S11, if desired. The method can then return to step S1 to manufacture and deploy additional IC products 350.

In addition or alternatively, methods according to the present disclosure can include other defect management steps. With the adjusted form of reliability model 306, calculator 322 of computer system 302 can calculate a "manufacturing defect density" value in step S12. The term "manufacturing defect density," as described elsewhere herein, can generally refer to the occurrence or likelihood of defects on a particular IC product 350, or within a particular area or sub-system of IC product 350. Methods of the present disclosure can also include computing several manufacturing defect densities for different types of products and/or defects.

Methods of the present disclosure can optionally include further actions for managing semiconductor manufacturing defects. After calculating a manufacturing defect density value in step S12, methods of the present disclosure can include prioritizing module 328 assigning relative probability values to each known or potential semiconductor manufacturing defect in step S13. Each relative probability value can represent the likelihood of a particular defect occurring relative to other defects. Several possible defects can be listed in potential defect list 506 (FIG. 4). In step S13, each defect within defect list 506 (FIG. 4) can be ranked from highest probability to lowest probability. Where the probability of a defect changes after adjusting reliability model 306, prioritizing module 328 can reprioritize each defect within defect list 506 (FIG. 4) to reflect current data. Thus, potential defect list 506 (FIG. 5) of manufacturing line 500 (FIG. 4) can be updated to reflect the actual probability of particular defects in embodiments of the present disclosure.

In another embodiment, methods according to the present disclosure can include measuring a production parameter for each IC product 350 with manufacturing sensor 510 (FIG. 4) in step S14. Measurements collected with manufacturing sensors 510 (FIG. 4) can identify which defects originate from production parameters or errors in manufacturing line 500 (FIG. 4), as opposed to defects which may occur during operation of an IC product 350. The production parameters measured in step S14 can be factored into the predicted cumulative aging parameters calculated with reliability model 306 in step S11, and/or used directly to adjust reliability model 306 as shown by the corresponding process flow shown in phantom.

Following the assigning of relative priorities in step S13, the method can conclude with manufacturing line 500 (FIG. 4) continuing to operate with the adjusted version of reliability model 306 and/or other calculated quantities. Alternatively, embodiments of the present disclosure can repeat the steps discussed herein in a repeating loop to further adjust reliability model 306.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose features of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of managing semiconductor manufacturing defects, the method comprising:
   determining a cumulative aging parameter for each of a plurality of first IC products produced with a manufacturing line and included within a shared system, wherein each of the plurality of first IC products are communicatively connected to a reliability model for the manufacturing line, and wherein the cumulative aging parameter is dependent on a product operating condition;
   calculating an observed defect rate for the plurality of first IC products based on the cumulative aging parameter for each of the plurality of first IC products;
   adjusting the reliability model for the manufacturing line in response to the observed defect rate being different from an initial predicted defect rate for the plurality of first IC products, wherein the adjusting of the reliability model includes:
      adjusting a variable related to a root failure cause of a selected first IC product from the plurality of first IC products to yield a new predicted defect rate, wherein the variable includes an aging parameter defined as electromigration degradation of circuitry in the selected first IC product;
      calculating a manufacturing defect density based on the observed defect rate; and
      assigning a relative probability to each of a plurality of potential semiconductor manufacturing defects based on the manufacturing defect density; and
   redistributing an operating load on the plurality of first IC products within the shared system based on the adjusted reliability model.

2. The method of claim 1, wherein the cumulative aging parameter includes a total operating time.

3. The method of claim 1, wherein the plurality of first IC products includes a failed IC product.

4. The method of claim 3, further comprising determining the root failure cause for the failed IC product based on the cumulative aging parameter.

5. The method of claim 1, wherein the product operating condition includes one of a temperature and a voltage.

6. The method of claim 1, further comprising determining a production parameter for each of the plurality of first IC products with a manufacturing sensor, wherein the adjusting of the manufacturing reliability model is further in response to the determined production parameter.

7. The method of claim 1, further comprising:
determining the cumulative aging parameter for each of a plurality of second IC products produced with the particular manufacturing line; and
calculating an observed defect rate for the plurality of second IC products based on the cumulative aging parameter of each of the second IC products;
wherein the adjusting of the manufacturing reliability model for the particular manufacturing line further includes adjusting variables based on the observed defect rate for the plurality of second IC products being different from a predicted defect rate for the plurality of second IC products.

8. The method of claim 1, wherein the redistributing of the operating load includes reducing an electrical load on one IC product in the plurality of first IC products and increasing an electrical load on another IC product in the plurality of first IC products.

9. The method of claim 1, wherein the product operating condition includes an effective operating temperature ($T_{teff}$) for each of the plurality of first IC products over a time interval $\Delta t$, the effective operating temperature being determined by the formula:

$$T_{teff} = \left\{ \frac{1}{T_{des}} - \frac{\ln\left[\Sigma\left(\frac{\Delta t_i}{t_{op}}\right)e^{\left[\frac{\Delta H}{k}\left(T_{des}^{-1} - T_i^{-1}\right)\right]}\right]}{\left(\frac{\Delta H}{k}\right)} \right\}^{-1}, \quad t_{op} = \sum_{i=1}^{\infty} \Delta t_i$$

wherein $T_{teff}$ represents a time domain value of the effective operating temperature, $t_{op}$ represents an operation time of a device under analysis, $T_{des}$ represents a design operating temperature of the device under analysis, $T_i$ represents a measured temperature of the device under analysis at a respective tracking interval, $\Delta t_i$ represents the respective tracking interval, $\Delta H$ represents electromigration activation energy, and k represents Boltzmann's constant.

10. The method of claim 9, wherein the cumulative aging parameter includes an effective operating time ($t_{op_{eff}}$) for the device under analysis, the effective operating time being determined by the formula:

$$t_{op_{eff}} = \Delta t \cdot e^{\frac{\Delta H}{k}\left(\frac{1}{T_{des}} - \frac{1}{T_{seff}}\right)}$$

wherein $t_{op\ eff}$ represents effective operating time or time of operation for the device under analysis, $T_{seff}$ represents a space domain value of an effective temperature for the device, M represents a total number of temperature sensors on the device under analysis, $T_{des}$ represents a design or nominal operating temperature of the device under anaylsis, k represents Boltzmann's constant, and $\Delta t$ represents an actual elapsed time of operation for the device under analysis.

11. A system for managing semiconductor manufacturing defects, the system comprising:
a determining component which determines a cumulative aging parameter for each of a plurality of IC products produced with a manufacturing line and included within a shared system, wherein each of the plurality of IC products are communicatively connected to a reliability model for the manufacturing line, and wherein the cumulative aging parameter is dependent on a product operating condition;
a calculating component which calculates an observed defect rate for the plurality of IC products based on the cumulative aging parameter for each of the plurality of IC products;
a modeling component which adjusts the reliability model for the manufacturing line in response to the observed defect rate being different from an initial predicted defect rate for the plurality of IC products, wherein the adjusting of the reliability model includes:
adjusting a variable related to a root failure cause of a selected first IC product from the plurality of first IC products to yield a new predicted defect rate, wherein the variable includes an aging parameter defined as electromigration degradation of circuitry in the selected first IC products; and
calculating a manufacturing defect density based on the observed defect rate; and
a prioritization component which assigns a relative probability to each of a plurality of potential semiconductor manufacturing defects based on the manufacturing defect density, and redistributes an operating load on the plurality of first IC products within the shared system based on the adjusted reliability model.

12. The system of claim 11, wherein the cumulative aging parameter includes a total operating time.

13. The system of claim 11, wherein the plurality of IC products includes a failed IC product.

14. The system of claim 13, further comprising a diagnostic component which determines the root failure cause for the failed IC product based on the cumulative aging parameter.

15. The system of claim 11, wherein the product operating condition includes one of a temperature and a voltage.

16. The system of claim 11, wherein the shared system includes a central data repository which stores the cumulative aging parameters of each of the plurality of IC products.

17. A program product stored on a non-transitory computer readable storage medium, the program product operative to manage semiconductor manufacturing defects when executed, the non-transitory computer readable storage medium comprising program code for:
determining a cumulative aging parameter for each of a plurality of first IC products produced with a manufacturing line and included within a shared system, wherein each of the plurality of IC products are communicatively connected to a reliability model for the manufacturing line, and wherein the cumulative aging parameter is dependent on a product operating condition;
calculating an observed defect rate for the plurality of IC products based on the cumulative aging parameter for each of the plurality of IC products;
adjusting the reliability model for the manufacturing line in response to the observed defect rate being different from an initial predicted defect rate for the plurality of first IC products, wherein the adjusting of the reliability model includes:
adjusting a variable related to a root failure cause of a selected first IC product from the plurality of first IC products to yield a new predicted defect rate, wherein the variable includes an aging parameter defined as electromigration degradation of circuitry in the selected first IC product;
calculating a manufacturing defect density based on the observed defect rate; and assigning a relative probability to each of a plurality of potential semiconductor manufacturing defects based on the manufacturing defect density; and redistributing an operating load on the plurality of first IC products within the shared system based on the adjusted reliability model.

\* \* \* \* \*